(12) United States Patent
Lu et al.

(10) Patent No.: US 9,263,294 B2
(45) Date of Patent: Feb. 16, 2016

(54) METHOD OF FORMING SEMICONDUCTOR DEVICE

(71) Applicant: United Microelectronics Corp., Hsinchu (TW)

(72) Inventors: Chia-Lin Lu, Taoyuan County (TW); Chun-Lung Chen, Tainan (TW); Kun-Yuan Liao, Hsinchu (TW); Feng-Yi Chang, Tainan (TW); Chieh-Te Chen, Kaohsiung (TW); Cheng-Hsing Chuang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/273,283

(22) Filed: May 8, 2014

(65) Prior Publication Data
US 2015/0325453 A1 Nov. 12, 2015

(51) Int. Cl.
*H01L 21/4763* (2006.01)
*H01L 21/311* (2006.01)

(52) U.S. Cl.
CPC .... *H01L 21/31111* (2013.01); *H01L 21/31133* (2013.01); *H01L 21/31144* (2013.01)

(58) Field of Classification Search
CPC .......... H01L 21/76802; H01L 21/76814; H01L 21/76819; H01L 21/31111; H01L 21/31144
USPC ................... 438/637, 639; 257/211
See application file for complete search history.

(56) References Cited

U.S. PATENT DOCUMENTS

| | | | |
|---|---|---|---|
| 4,795,722 A | 1/1989 | Welch et al. | |
| 7,799,511 B2 | 9/2010 | Chou et al. | |
| 2010/0009531 A1* | 1/2010 | Choi | H01L 21/28273 438/643 |
| 2013/0109151 A1 | 5/2013 | Hsu et al. | |
| 2014/0370684 A1* | 12/2014 | Khurana et al. | 438/386 |

* cited by examiner

*Primary Examiner* — Tu-Tu Ho
(74) *Attorney, Agent, or Firm* — J.C. Patents

(57) ABSTRACT

A method of forming a semiconductor device is provided. A material layer, a first flowing material layer and a first mask layer are sequentially formed on a substrate. A first etching process is performed by using the first mask layer as a mask, so as to form a first opening in the material layer. The first mask layer and the first flowing material layer are removed. A filler layer is formed in the first opening. A second flowing material layer is formed on the material layer and the filler layer. A second mask layer is formed on the second flowing material layer. A second etching process is performed by using the second mask layer as a mask, so as to form a second opening in the material layer.

17 Claims, 4 Drawing Sheets

METHOD OF FORMING SEMICONDUCTOR DEVICE

BACKGROUND OF THE INVENTION

1. Field of Invention

The present invention relates to an integrated circuit (IC) fabrication, and particularly to a method of forming a semiconductor device.

2. Description of Related Art

As the level of integration of integrated circuits is getting increased, the demand for increasing the feature density or reducing the pitch size becomes the mainstream in the semiconductor industry, and the key technology is in photolithography.

When the pitch size is beyond the photolithography resolution, a single exposure step is no longer applicable due to the pitch constraint. The pattern decomposition (or called "pattern split" or "double patterning") technique is accordingly developed to meet the process requirements. After the target pattern is decomposed into two patterns respectively defined on two photomasks, the 2P2E (photo-etch-photo-etch) approach utilizing two photolithography steps and two etching steps is implemented. However, it is relatively difficult to control the critical dimension (CD) bias between the double patterning steps, and the device performance may be therefore deteriorated.

SUMMARY OF THE INVENTION

The present invention provides a method of forming a semiconductor device, in which the CD bias (e.g. opening size variation) between the double patterning steps can be minimized, so that the device performance can be accordingly improved.

The present invention provides a method of forming a semiconductor device. A material layer is formed on a substrate. A first flowing material layer is formed on the material layer. A first mask layer is formed on the first flowing material layer. A first etching process is performed by using the first mask layer as a mask, so as to form a first opening in the material layer. The first mask layer and the first flowing material layer are removed. A filler layer is formed in the first opening. A second flowing material layer is formed on the material layer and the filler layer. A second mask layer is formed on the second flowing material layer. A second etching process is performed by using the second mask layer as a mask, so as to form a second opening in the material layer.

According to an embodiment of the present invention, a material of the first flowing material layer is the same as a material of the second flowing material layer.

According to an embodiment of the present invention, a recipe of forming the first flowing material layer is the same as a recipe of forming the second flowing material layer.

According to an embodiment of the present invention, a thickness of the first flowing material layer on the material layer is substantially the same as a thickness of the second flowing material layer on the material layer.

According to an embodiment of the present invention, a recipe of the first etching process is the same as a recipe of the second etching process.

According to an embodiment of the present invention, the filler layer includes a third flowing material layer.

According to an embodiment of the present invention, a material of the third flowing material layer is the same as a material of the second flowing material layer.

According to an embodiment of the present invention, the third flowing material layer includes a photoresist material, an organic dielectric layer (ODL), a bottom anti-reflection coating (BARC), a light-absorbing oxide material or a combination thereof.

According to an embodiment of the present invention, a method of forming the filler layer includes forming a filler material layer on the material layer filling the first opening, and removing the filler material layer outside of the first opening.

According to an embodiment of the present invention, a method of removing the filler material layer outside of the first opening includes performing an etching back process or a chemical mechanical polishing process.

According to an embodiment of the present invention, the filler layer and the second mask layer includes different photoresist materials photosensitive to different wavelengths.

According to an embodiment of the present invention, the method further includes forming a first silicon-containing hard-mask bottom anti-reflection coating (SHB) layer before the step of forming the first mask layer, and forming a second SHB layer before the step of forming the second mask layer.

The present invention further provides a method of forming a semiconductor device. A material layer is formed on a substrate. A first opening is formed in the material layer. A filler layer is formed in the first opening. A flowing material layer is formed on the material layer and the filler layer. A mask layer is formed on the flowing material layer. An etching process is performed by using the mask layer as a mask, so as to form a second opening in the material layer.

According to an embodiment of the present invention, a method of forming the filler layer includes forming a filler material layer on the material layer filling the first opening, and removing the filler material layer outside of the first opening.

According to an embodiment of the present invention, a method of removing the filler material layer outside of the first opening includes performing an etching back process or a chemical mechanical polishing process.

According to an embodiment of the present invention, the filler layer and the mask layer includes different photoresist materials photosensitive to different wavelengths.

According to an embodiment of the present invention, the filler layer includes a photoresist material, an organic dielectric layer (ODL), a bottom anti-reflection coating (BARC), a light-absorbing oxide material or a combination thereof.

The present invention also provides a method of forming a semiconductor device. A material layer is formed on a substrate. A first patterning process is performed to form a first opening in the material layer. A filler layer is formed in the first opening. A second patterning process is performed to form a second opening in the material layer.

According to an embodiment of the present invention, the filler layer includes a flowing material layer.

According to an embodiment of the present invention, the flowing material layer includes a photoresist material, an organic dielectric layer (ODL), a bottom anti-reflection coating (BARC), a light-absorbing oxide material or a combination thereof.

In view of the above, in the present invention, after the first patterning process of forming a first opening, a filler layer is formed in the first opening before the second patterning process of forming a second opening. Therefore, a better topography is provided during the second patterning process, and a second opening substantially equal to the first opening is accordingly formed. In other words, with such method, the CD bias (e.g. the variation of the first and second openings respectively formed in the first and second patterning processes) can be significantly reduced, and thus, the performance of the device can be greatly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
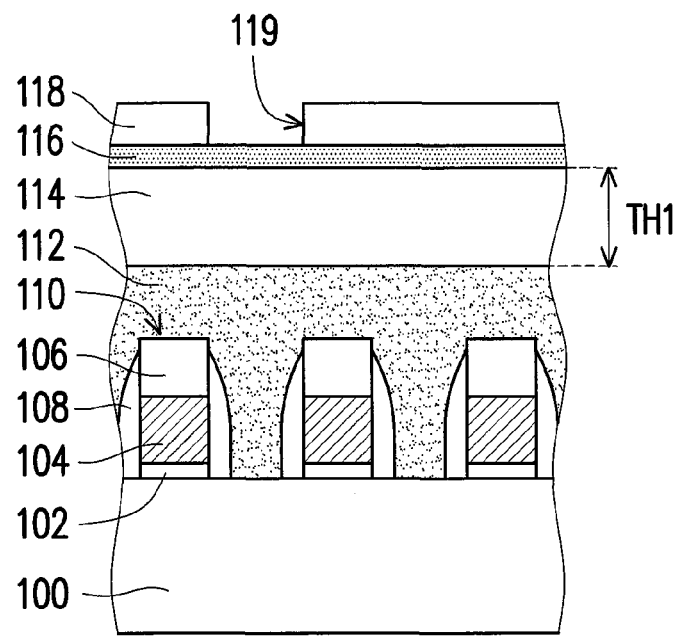
FIG. 1A to FIG. 1G are schematic cross-sectional views of a method of forming a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1G are schematic cross-sectional views of a method of forming a semiconductor device according to an embodiment of the present invention.

Referring to FIG. 1A, a substrate 100 having multiple gate structures 110 is provided. In an embodiment, the substrate 100 can be a silicon-containing bulk substrate with shallow trench isolation (STI) structures (not shown) therein. In another embodiment, the substrate 100 can be a silicon-containing substrate with multiple fins (not shown) extending in a first direction, and the gate structures 110 cross the fins and extend in a second direction different from the first direction.

Each gate structure 110 includes an interfacial layer 102, a gate 104 and an optional cap layer 106 sequentially formed on the substrate 100. The interfacial layer 102 includes silicon oxide, silicon nitride, silicon oxynitride, a high-k material with a dielectric constant greater than 4, or a combination thereof. The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. The gate 104 can be a polysilicon gate or a metal gate containing aluminum (Al) or tungsten (W). The cap layer 106 includes silicon oxide, silicon nitride or a combination thereof.

Still referring to FIG. 1A, each gate structure 110 further includes a spacer 108 formed on the sidewall of the corresponding gate 104. The spacers 108 include silicon oxide, silicon nitride or a combination thereof. Besides, each gate structure 110 also includes source/drain regions (not shown) formed on the fins or in the substrate 100 between the gate structures 110. The source/drain regions include doped regions, SiGe, SiC or a combination thereof.

The embodiment of FIG. 1A in which each of the interfacial layer 102, the gate 104, the cap layer 106 and the spacer 108 is illustrated as a single-layer structure, but the present invention is not limited thereto. It should be appreciated by persons having ordinary skill in the art that each of the said components can be a composite layer or a multi-layer structure upon the process requirements.

Thereafter, a material layer 112 is formed on the substrate 100. Specifically, the material layer 112 is formed to fill up the gaps between the gate structures 110 and cover the tops of the gate structures 110. In an embodiment, the material layer 112 includes silicon oxide, silicon nitride, silicon oxynitride, a low-k material with a dielectric constant less than 4, a suitable insulating material or a combination thereof. The low-k material includes flowable oxide (FOX), undoped silicate glass (USG), borosilicate glass (BSG), phosphosilicate glass (PSG), borophosphosilicate glass (BPSG), plasma-enhanced tetraethylorthosilicate (PE-TEOS) or a combination thereof. In addition, a contact etch stop layer (CESL) (not shown) can be optionally formed prior to the formation of the material layer 112. The CESL includes silicon nitride or a suitable insulating material.

Continue referring to FIG. 1A, a first flowing material layer 114, a first Si-containing hard-mask bottom anti-reflection coating (SHB) layer 116 and a first mask layer 118 are sequentially formed on the material layer 112. The first flowing material layer 114 includes a photoresist material, an organic dielectric layer (ODL), a bottom anti-reflection coating (BARC), a light-absorbing oxide material or a combination thereof. The light-absorbing oxide material can be DUO™248 (made by Honeywell Electronic Materials, a silicon-rich BARC material containing an organosiloxane-based polymer), but is not limited thereto. The first SHB layer 116 includes organosilicon polymer or polysilane. The method of forming each of the first flowing material layer 114 and the first SHB layer 116 includes performing a spin-coating process. The first mask layer 118 can include a photoresist material. The method of forming the first mask layer 118 includes performing a first photolithography process with a first photomask. In this embodiment, the first mask layer 118 can be a patterned photoresist layer has at least one opening pattern 119 formed therein.

In an embodiment, the first flowing material layer 114 can be an organic dielectric layer (ODL), and the first mask layer 118 can be a 248 nm (KrF) photoresist layer or a 193 nm (ArF) photoresist layer. In another embodiment, the first flowing material layer 114 and the first mask layer 118 include different photoresist materials photosensitive to different wavelengths. The photoresist material included in the first flowing material layer 114 or the first mask layer 118 is selected from the group consisting of a 436 nm (G-line) photoresist, a 405 nm (H-line) photoresist, a 365 nm (I-line) photoresist, a 248 nm (KrF) photoresist and a 193 nm (ArF) photoresist. Besides, the photoresist material included in the first mask layer 118 has a photolithography resolution better than that included in the first flowing material layer 114. For example, the first mask layer 118 includes a 193 nm (ArF) photoresist, and the first flowing material layer 114 includes a 365 nm (I-line) photoresist, but the present invention is not limited thereto.

Figure 1B:
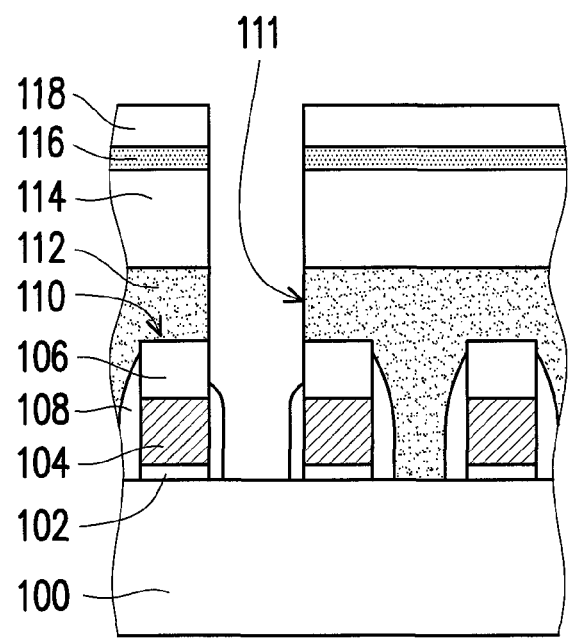

Referring to FIG. 1B, a first etching process is performed by using the first mask layer 118 as a mask, so as to form a first opening 111 in the material layer 112 between the two corresponding gate structures 110. Specifically, the first etching process such as a dry etching process transforms the opening pattern 119 of the first mask layer 118 to the underlying layers, and therefore the first opening 111 corresponding to the opening pattern 119 is formed in the material layer 112. In an embodiment, a portion of the spacer 108 may be simultaneously removed during the first etching process, as shown in FIG. 1B. In another embodiment (not shown), a portion of the spacer 108 and a portion of the cap layer 106 may be simultaneously removed during the first etching process. In yet another embodiment (not shown), the spacer 108 and the cap layer 106 substantially maintain intact during the first etching process. Thereafter, the first mask layer 118, the first SHB layer 116 and the first flowing material layer 114 are removed. The removing step includes a dry etching, a wet etching, a cleaning or a combination thereof.

Figure 1C:
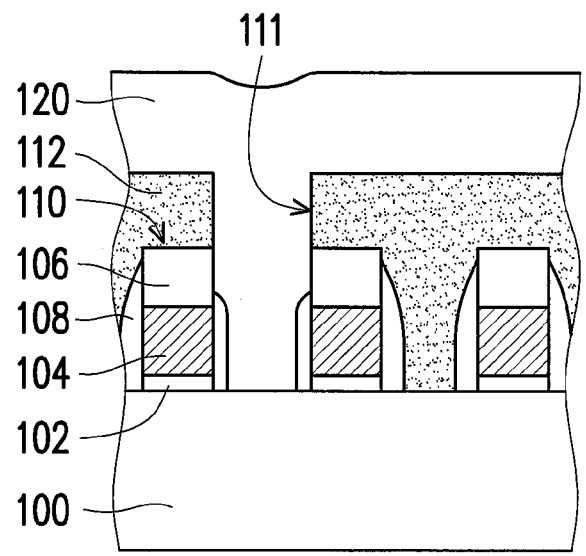

Referring to FIG. 1C, a filler material layer 120 is formed on the material layer 112 filling in the first opening 111. In an embodiment, the filler material layer 120 can be a flowing material layer including a photoresist material, an organic dielectric layer (ODL), a bottom anti-reflection coating (BARC), a light-absorbing oxide material or a combination thereof. Besides, the flowing material included in the filler material layer 120 can be the same as or different from that of the first flowing material layer 114.

Figure 1D:
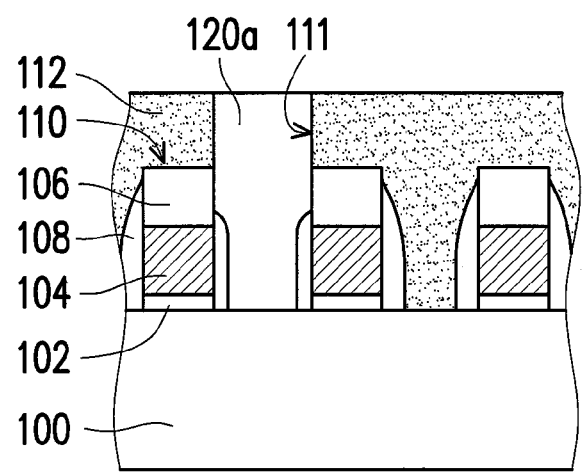
Figure 2:
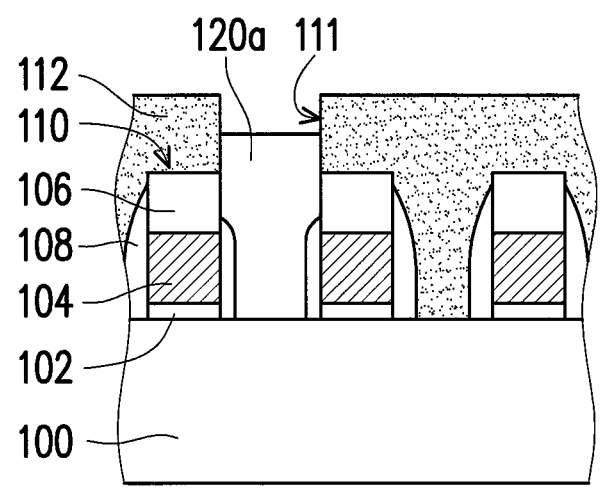
FIG. 2 is a schematic cross-sectional view of a step of a method of forming a semiconductor device according to another embodiment of the present invention.

Referring to FIG. 1D, the filler material layer 120 outside of the first opening 111 is removed, and therefore a filler layer 120a is formed in the first opening 111. In an embodiment, the removing step includes performing a chemical mechanical polishing (CMP) process with the material layer 112 as a stop layer, so that the top surface or the filler layer 120a is substantially coplanar with that of the material layer 112, as shown in FIG. 1D. In another embodiment, the removing step includes performing an etching back process, so that the top surface or the filler layer 120a can be lower than that of the material layer 112 (as shown in FIG. 2), and the height of the filler layer 120a can be controlled by a time mode. In an embodiment, the first opening 111 is filled with the filler layer 120a to a height of at least ⅔ of the overall height.

Figure 1E:
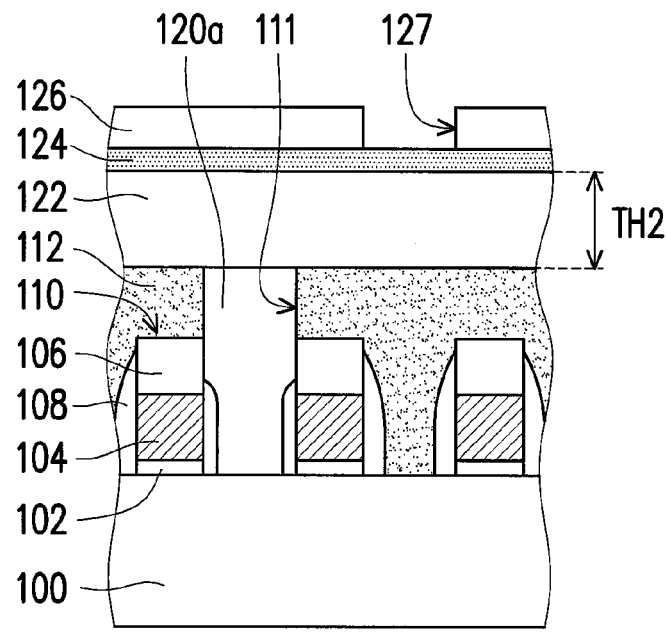

Referring to FIG. 1E, a second flowing material layer 122 is formed on the material layer 112 and the filler layer 120a. Thereafter, a second SHB layer 124 and a second mask layer 126 are sequentially formed on the second flowing material layer 122. The materials and forming methods of the second flowing material layer 122, the second SHB layer 124 and the second mask layer 126 are similar to those of the first flowing material layer 114, the first SHB layer 116 and the first mask layer 118, and the details are not iterated herein. Here, the second mask layer 126 can include a photoresist material, and the forming method thereof includes performing a second photolithography process with a second photomask. In this embodiment, the second mask layer 126 can be a patterned photoresist layer has at least one opening pattern 127 therein.

Since the filler material layer 120 is partially removed during the step in FIG. 1D, the recipe of forming the filler material layer 120 does not matter. In other words, the filler material layer 120 can be formed to have a thickness greater than, equal to or less than the thickness of the first flowing material layer 114 or the second flowing material layer 122. In an embodiment, the filler material layer 120 and the first flowing material layer 114 (or the second flowing material layer 122) can include the same material formed with the same recipe. In another embodiment, the filler material layer 120 and the first flowing material layer 114 (or the second flowing material layer 122) can include the same material formed with different recipes.

In this embodiment, in terms of process control and availability, the filler material layer 120 can include a material the same as that of the first flowing material layer 114 and the second flowing material layer 122. Besides, the filler material layer 120, the first flowing material layer 114 and the second flowing material layer 122 can be formed with the same recipe.

Besides, the filler layer 120a and the second mask layer 126 can include different photoresist materials photosensitive to different wavelengths. The photoresist material included in the filler layer 120a or the second mask layer 126 is selected from the group consisting of a 436 nm (G-line) photoresist, a 405 nm (H-line) photoresist, a 365 nm (I-line) photoresist, a 248 nm (KrF) photoresist and a 193 nm (ArF) photoresist. Besides, the photoresist material included in the second mask layer 126 has a photolithography resolution better than that included in the filler layer 120a. For example, the second mask layer 126 includes a 193 nm (ArF) photoresist, and the filler layer 120a includes a 365 nm (I-line) photoresist, but the present invention is not limited thereto.

Figure 1F:
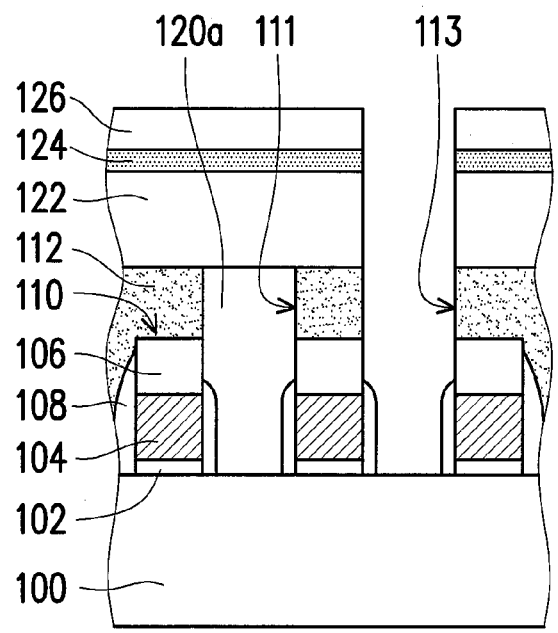

Referring to FIG. 1F, a second etching process is performed by using the second mask layer 126 as a mask, so as to form a second opening 113 in the material layer 112 between the two corresponding gate structures 110. Specifically, the second etching process such as a dry etching process transforms the opening pattern 127 of the second mask layer 126 to the underlying layers, and therefore the second opening 113 corresponding to the opening pattern 127 is formed in the material layer 112. In an embodiment, a portion of the spacer 108 may be simultaneously removed during the second etching process, as shown in FIG. 1F. In another embodiment (not shown), a portion of the spacer 108 and a portion of the cap layer 106 may be simultaneously removed during the second etching process. In yet another embodiment (not shown), the spacer 108 and the cap layer 106 substantially maintain intact during the second etching process. In an embodiment, in terms of process control and availability, the recipe of the first etching process can be the same as that of the second etching process.

In view of the above, the first photolithography process in FIG. 1A and the first etching process in FIG. 1B are regarded as a first patterning process of forming the first opening 111 in the material layer 112, and the second photolithography process in FIG. 1E and the first etching process in FIG. 1F are regarded as a second patterning process of forming the second opening 113 in the material layer 112. In this embodiment, the first opening 111 and the second opening 113 are closely adjacent to each other and are defined by different patterning processes due to the pitch constraint, but the present invention is not limited thereto. In another embodiment, the first opening 111 and the second opening 113 can be separated by a distance.

The said embodiment in which the first and second openings 111 and 113 are contact holes is provided for illustration purposes, and is not construed as limiting the present invention. It is appreciated by people having ordinary skill in the art that the first and second openings 111 and 113 can be via holes between metal layers or holes/openings formed in the same layer but defined by different patterning steps.

Figure 1G:
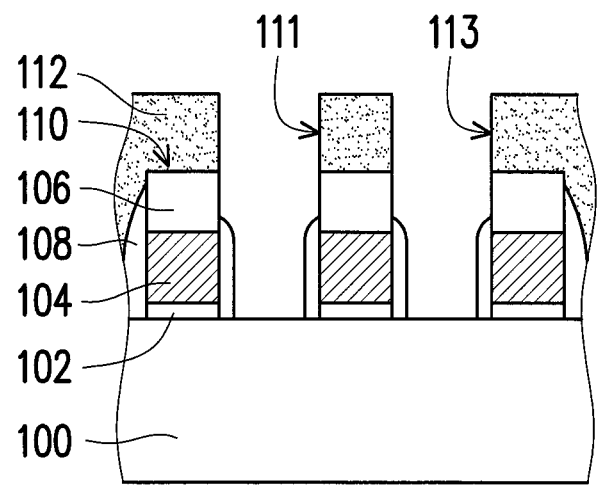

Referring to FIG. 1G, the second mask layer 126, the second SHB layer 124, the second flowing material layer 122 and the filler layer 120a are removed. The removing step includes a dry etching, a wet etching, a cleaning or a combination thereof. Here, the second flowing material layer 122 and the filler layer 120a can include the same or different material as long as they can be simultaneously removed during the removing step. The "2P2E (photo-etch-photo-etch)" or "double patterning" technique of the present invention is thus completed.

The following steps after the removing step include forming contact plugs within the first and second openings 111 and 113, forming interconnections etc. These steps are well-known to people having ordinary skill in the art and are not iterated herein.

In the present invention, in terms of process control and availability, the first flowing material layer 114 and the second flowing material layer 122 can include the same material formed with the same recipe. Besides, the recipe of the first etching process can be the same as that of the second etching process. In such case, without the filler layer of the invention, the second flowing material layer may flow into the first opening, resulting in a thinner thickness on the material layer and a bad topography. Thus, a wider second opening is accordingly generated. More specifically, with the conventional 2P2E method, the thickness of the second flowing material layer on the material layer may be thinner than that of the first flowing material layer on the material layer, and therefore a second opening wider than the first opening is formed due to the underlying bad topography.

However, with the method of the invention, after the first opening 111 is formed with the first patterning process, a filler layer 120a is formed in the first opening 111 prior to the second patterning process, and thus, the second flowing material layer 122 can be formed with a thickness (e.g. TH2 as shown in FIG. 1E) substantially the same as the thickness (e.g. TH1 as shown in FIG. 1A) of the first flowing material layer 114. Therefore, a better topography is obtained and a second opening 113 substantially equal to the first opening 111 is accordingly generated.

In summary, the filler layer of the invention plays an important role in eliminating the opening size variation between the double patterning steps. Specifically, the filler layer is formed in the first opening after the first patterning process and before the second patterning process. Therefore, a better topography is provided during the second patterning process. As a result, the CD bias (e.g. opening size variation) between the double patterning steps can be minimized. With the method of the invention, the competitive advantage can be easily achieved, and the performance of the device can be greatly improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
   forming a material layer on a substrate;
   forming a first flowing material layer on the material layer;
   forming a first mask layer on the first flowing material layer;
   performing a first etching process by using the first mask layer as a mask, so as to form a first opening in the material layer;
   removing the first mask layer and the first flowing material layer;
   forming a filler layer in the first opening;
   forming a second flowing material layer on the material layer and the filler layer;
   forming a second mask layer on the second flowing material layer; and
   performing a second etching process by using the second mask layer as a mask, so as to form a second opening in the material layer,
   wherein a recipe of the first etching process is the same as a recipe of the second etching process.

2. The method of claim 1, wherein a material of the first flowing material layer is the same as a material of the second flowing material layer.

3. The method of claim 2, wherein a recipe of forming the first flowing material layer is the same as a recipe of forming the second flowing material layer.

4. The method of claim 1, wherein a thickness of the first flowing material layer on the material layer is substantially the same as a thickness of the second flowing material layer on the material layer.

5. The method of claim 1, wherein the filler layer comprises a third flowing material layer.

6. The method of claim 5, wherein a material of the third flowing material layer is the same as a material of the second flowing material layer.

7. The method of claim 5, wherein the third flowing material layer comprises a photoresist material, an organic dielectric layer (ODL), a bottom anti-reflection coating (BARC), a light-absorbing oxide material or a combination thereof.

8. The method of claim 1, wherein a method of forming the filler layer comprises:
   forming a filler material layer on the material layer filling the first opening; and
   removing the filler material layer outside of the first opening.

9. The method of claim 8, wherein a method of removing the filler material layer outside of the first opening comprises performing an etching back process or a chemical mechanical polishing process.

10. The method of claim 1, wherein the filler layer and the second mask layer comprises different photoresist materials photosensitive to different wavelengths.

11. The method of claim 1, further comprising:
    forming a first silicon-containing hard-mask bottom anti-reflection coating (SHB) layer before the step of forming the first mask layer; and
    forming a second SHB layer before the step of forming the second mask layer.

12. A method of forming a semiconductor device, comprising:
    forming a material layer on a substrate;
    forming a first opening in the material layer;
    forming a filler layer only in the first opening;
    forming a flowing material layer on the material layer and the filler layer;
    forming a mask layer on the flowing material layer; and
    performing an etching process by using the mask layer as a mask, so as to form a second opening in the material layer,
    wherein a method of forming the filler layer comprises:
    forming a filler material layer on the material layer filling the first opening; and
    removing the filler material layer outside of the first opening.

13. The method of claim 12, wherein a method of removing the filler material layer outside of the first opening comprises performing an etching back process or a chemical mechanical polishing process.

14. The method of claim 12, wherein the filler layer and the mask layer comprises different photoresist materials photosensitive to different wavelengths.

15. The method of claim 12, wherein the filler layer comprises a photoresist material, an organic dielectric layer (ODL), a bottom anti-reflection coating (BARC), a light-absorbing oxide material or a combination thereof.

16. A method of forming a semiconductor device, comprising:

forming a material layer on a substrate;
performing a first patterning process to form a first opening in the material layer;
forming a filler layer only in the first opening; and
performing a second patterning process to form a second opening in the material layer,
wherein the flowing material layer comprises a photoresist material, an organic dielectric layer (ODL), a bottom anti-reflection coating (BARC), a light-absorbing oxide material or a combination thereof.

17. The method of claim 16, wherein the filler layer comprises a flowing material layer.

* * * * *